United States Patent [19]
Farooq et al.

[11] Patent Number: 5,874,369
[45] Date of Patent: Feb. 23, 1999

[54] METHOD FOR FORMING VIAS IN A DIELECTRIC FILM

[75] Inventors: Mukta Shaji Farooq, Hopewell Junction; Mark Joseph LaPlante, Walden, both of N.Y.

[73] Assignee: International Business Machines Corporation, Armonk, N.Y.

[21] Appl. No.: 761,028

[22] Filed: Dec. 5, 1996

[51] Int. Cl.[6] .................................................. C03C 25/06
[52] U.S. Cl. ........................ 438/940; 438/707; 438/743; 438/744; 361/321.3; 361/321.4; 361/322
[58] Field of Search .................................. 438/707, 743, 438/744, 940; 361/321.3, 321.4, 322

[56] References Cited

U.S. PATENT DOCUMENTS

| | | | |
|---|---|---|---|
| 3,284,683 | 11/1966 | Reith . | |
| 3,305,394 | 2/1967 | Kaiser et al. | 117/217 |
| 4,471,405 | 9/1984 | Howard et al. | 361/305 |
| 4,892,592 | 1/1990 | Dickson et al. | 438/940 |
| 5,005,102 | 4/1991 | Larson | 361/313 |
| 5,096,850 | 3/1992 | Lippitt, III | 438/940 |
| 5,142,437 | 8/1992 | Kammerdiner et al. | 361/313 |
| 5,411,918 | 5/1995 | Keible et al. | 437/209 |
| 5,569,398 | 10/1996 | Sun et al. | 438/940 |
| 5,639,693 | 6/1997 | Koseki et al. | 438/940 |

*Primary Examiner*—Deborah Jones
*Attorney, Agent, or Firm*—Ira D. Blecker

[57] ABSTRACT

Vias are formed in a dielectric film overlying an electrode layer by sweeping a laser beam over the area in which the via is to be formed. In particular, a Nd:YAG laser, producing a beam of light having a 266 nm wave length, effectively ablates a barium strontium titanate dielectric film, without adversely affecting an underlying platinum electrode. The present invention overcomes the problem of wet chemical etching of dielectric films to form vias. Wet chemical etching often requires etchants that adversely affect the underlying metal electrode and typically require the use of environmentally undesirable chemicals.

7 Claims, 3 Drawing Sheets

METHOD FOR FORMING VIAS IN A DIELECTRIC FILM

BACKGROUND OF THE INVENTION

This invention relates generally to a method for forming vias in a dielectric film, and more particularly to such a method that includes forming vias in a dielectric layer by laser ablation.

Integrated, low inductance capacitors are essential to the operation of high performance, very large scale integrated (VLSI) semi-conductor packages. The integrated capacitors are typically part of a multi-layered ceramic (MLC) power stabilizing interposer containing through vias. Barium strontium titanate ($BaSrTiO_3$, commonly referred to as BST) is often used as a high dielectric constant material for decoupling capacitors. Typically, the BST dielectric material is deposited on platinum electrodes. Vias must then be formed through the BST film to provide electrical continuity between the platinum electrodes and components mounted on the interposer.

Currently, vias are formed in BST film by use of wet etch solutions which chemically etch the BST. This method includes a photolithography step to create a resist stencil on the surface of the BST film, followed by wet chemical etching of the BST in the desired locations. This method not only requires a considerable length of time to carry out, but is also expensive. A further problem is created because many of the recommended etchants are not selective with respect to the underlying platinum electrode, thus attacking and removing a portion of the electrode in the via formation process. In addition, some of the etchants, for example, aqua regia, hydrochloric acid, and the other strong acids, may present handling and disposal problems which further make the wet etching process undesirable.

The present invention is directed to overcoming the problems set forth above. It is desirable to have a clean, dry method for forming vias in a dielectric film that does not require resist processing, wet etching, or the use of hazardous chemicals. It is also desirable to have such a method that removes the dielectric material from preselected areas without adversely affecting the underlying electrode layer.

SUMMARY OF THE INVENTION

In accordance with one aspect of the present invention, a method for forming vias in a dielectric film includes forming an electrode layer on a prepared substrate. The electrode layer is formed of an electrically conductive material having relatively low light energy absorption characteristics with respect to a predefined laser beam. A dielectric layer is deposited on the electrode layer. The dielectric layer is formed of a material having a high dielectric constant and relatively high light absorption characteristics with respect to the predefined laser beam. Selected areas of the dielectric layer are ablated by directing the laser beam onto preselected areas whereby the dielectric material is removed from the selected areas of the dielectric layer without adversely affecting the underlying electrode layer.

Other features of the method of forming vias in a dielectric film, in accordance with the present invention, include the electrode layer being formed of platinum, the dielectric layer being formed of barium strontium titanate, and the laser beam being the fourth harmonic of the fundamental wavelength emitted from a neodymium doped yttrium-aluminum-garnet (Nd:YAG) laser.

BRIEF DESCRIPTION OF THE SEVERAL VIEWS OF THE DRAWING

A more complete understanding of the method for forming vias in a dielectric film, in accordance with the present invention, may be had by reference to the following detailed description when taken in conjunction with the accompanying drawings, wherein.

DETAILED DESCRIPTION OF THE INVENTION

Figure 1:
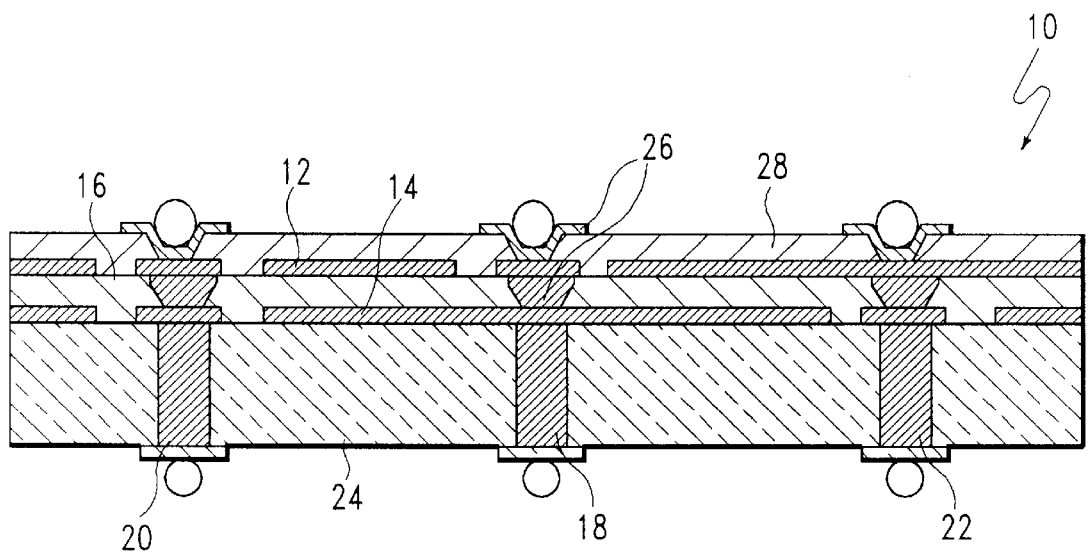
FIG. 1 is a schematic representation of an interposer capacitor having vias formed in the dielectric layer in accordance with the method embodying the present invention.

A thin film interposer capacitor 10, constructed in accordance with the method embodying the present invention, is shown in somewhat schematic fashion in FIG. 1. The capacitor 10 is a parallel plate capacitor having a thin film top electrode layer 12 and a segmented, complementary set of counter electrodes formed in a thin film layer 14. The top and bottom electrode layers 12, 14 are separated by a high permittivity dielectric layer 16 which serves as a spacer layer between the top and bottom electrode layers. The upper surface of the capacitor structure 10 is connected to the interface connections of chips which are, in turn, typically connected to a larger interconnection structure in an electronic system. The lower surface of the capacitor 10 is typically connected to a substrate providing electrical connection between the capacitor 10 to appropriate signal, power, and ground circuits. For example, the electrical circuit passing through a via 20 disposed at the left side of FIG. 1, may be connected to a signal circuit, whereas the circuit passing through the center via 18 may be connected to a power circuit, and the circuit passing through the far right via 22 may be connected to a ground circuit. The top electrode layer 12 is typically covered by a dielectric layer 28, such as polyimide. Appropriate electrically conductive features are provided through the top dielectric layer 28 for attachment of individual chips, integrated chips or chip modules. A common attachment method is known as C-4 (Controlled Collapsible Chip Connection).

In carrying out the present invention, conventional fabrication processes are used in the initial formation of the capacitor 10. For example, a multi-layered ceramic (MLC) substrate 24 is formed by conventional thin and/or thick film technology, with the vias 18, 20, 22 formed therein and metallized to provide electrical conductivity between appropriate conductor surfaces on, or in, the substrate 10. As represented by block 40 in FIG. 5, an electrode layer 14, preferably formed of platinum, is deposited directly onto the substrate 24. The platinum electrode layer 14 may be formed by any one of several conventional techniques such as chemical vapor deposition (CVD), plasma vapor deposition (PVD), electroplating and the like. The electrode layer 14 is then patterned to form discrete electrical circuit features by chemical etching, ion machining, reactive ion etching, or other processes well known in the art for forming discrete circuit elements in a metal layer.

Figure 2:
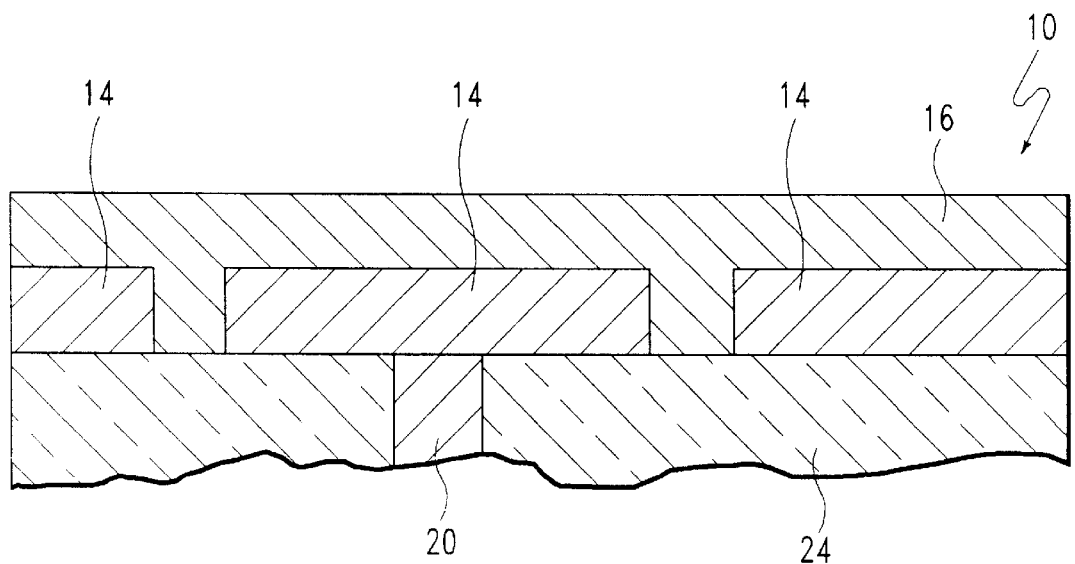
FIG. 2 is an enlarged sectional view representing a portion of a thin film capacitor constructed in accordance with the present invention, after formation of the electrode layer and deposition of the dielectric layer.
Figure 5:
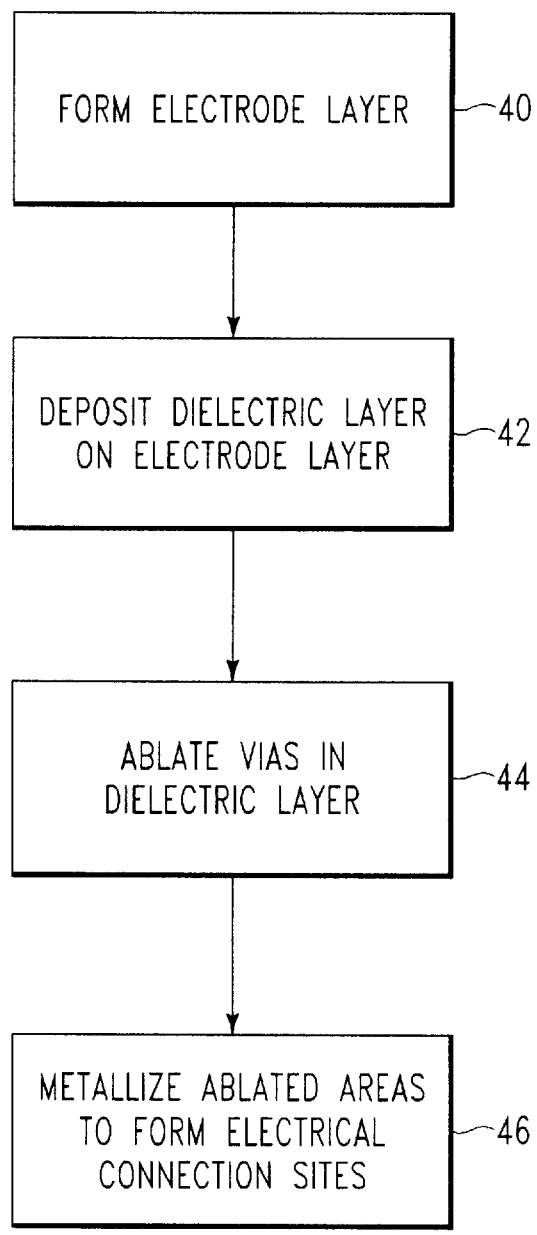
FIG. 5 is a flow chart representing the primary steps in the method for forming vias in a dielectric film in accordance with the present invention.

The dielectric layer 16 is then deposited directly over the patterned electrode layer 14 as indicated at block 42 in FIG. 5 and illustrated in FIG. 2. In carrying out the present invention, barium strontium titanate is used, for reasons to be explained below, as the preferred dielectric material. Typically, the electrode layer 14 may have a thickness of about 0.2 μm to about 6 μm. Depending on the desired capacitance characteristics, the dielectric layer 16 formed of barium strontium titanate may typically have a thickness of from about 0.02 μm to about 0.6 μm. Desirably, the barium strontium titanate layer is formed by CVD or PVD deposition, followed by high temperature annealing in an appropriate atmosphere as needed.

It has been discovered that barium strontium titanate is particularly receptive to the absorption of light energy having a wave length of about 266 nm, the fourth harmonic or quadrupled fundamental wave length of light provided in an infrared laser in which the active material is neodymium ions in an yttrium-aluminum-garnet crystal. Such a laser is commonly identified as a Nd:YAG, or simply a YAG laser. It was also found that platinum is highly reflective, i.e., had relatively low light energy absorption characteristics, with respect to the light energy produced by the quadrupled YAG laser. Taking advantage of this discovery in carrying out the present invention, the barium strontium titanate dielectric layer can be ablated, or removed as a result of absorption of light energy from the yag laser beam, without adversely affecting the underlying platinum electrode layer.

More specifically, a test wafer was formed on a Si/SiO$_2$ substrate 24, in which the SiO$_2$ had a thickness of about 4,000 Å. A platinum electrode layer 14 having a thickness of about 2,500 Å was deposited on the silicon substrate, followed by deposition of a barium strontium titanate dielectric film of about 600 Å over the platinum layer. Preselected areas of the barium strontium titanate layer were removed by moving a laser beam produced by the quadrupled YAG laser over the selected areas at a rate of about 0.3 mm/s. As mentioned above, the quadrupled YAG laser has a wave length of about 266 nm. The particular laser used in the above-described test had a range of fluence of from about 100 mJ/cm$^2$ to about 300 mJ/cm$^2$ at a pulse repetition rate of 1 kHz. The cross-sectional area of the beam was from about 3 μm to about 5 μm and was moved across the preselected area of the barium strontium titanate dielectric material at the above-mentioned 0.3 mm/s rate at a pitch of 5 μm between adjacent sweeps.

After ablation of the BST dielectric layer, electrical continuity was measured on the platinum electrode layer between two laser-ablated vias. The observed resistance was about 7 ohms, indicating good electrical continuity between the measured points. No electrical continuity was observed between two points on the surface of the barium strontium titanate, indicating no electrical continuity between the measured points. The underlying platinum electrode could be readily observed in photomicrographs of the laser-ablated vias. Although some superficial surface changes on the platinum electrode were visible at high energy processing levels, no ablation was observed. The platinum electrode was not etched when the via was formed in accordance with the above-described parameters used to etch the barium strontium titanate.

Figure 3:
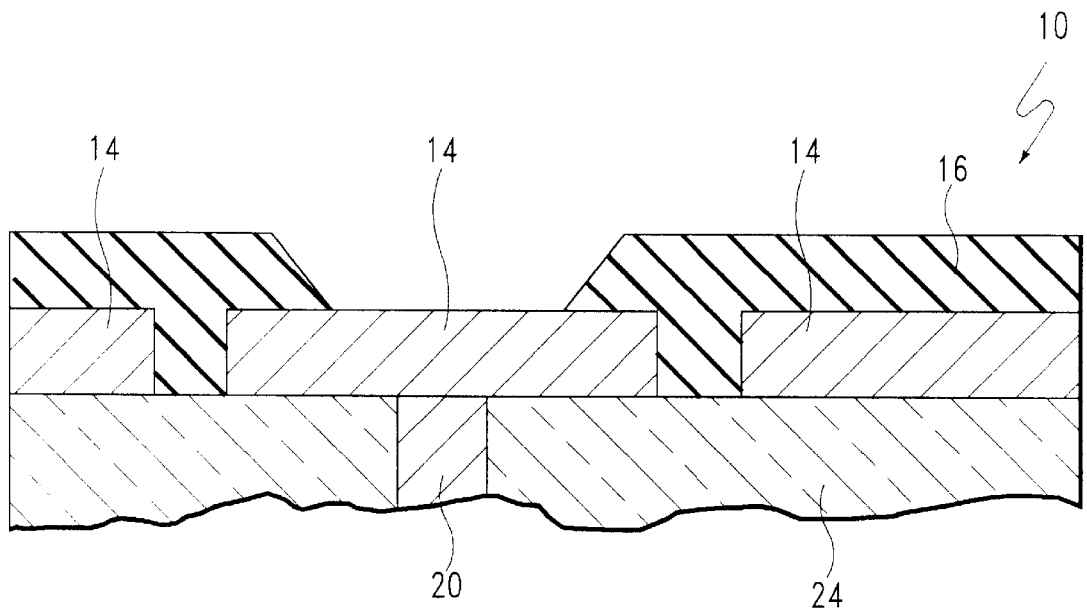
FIG. 3 is an enlarged sectional view representing a portion of a thin film capacitor formed in accordance with the present invention, after ablation of a portion of the dielectric layer.
Figure 4:
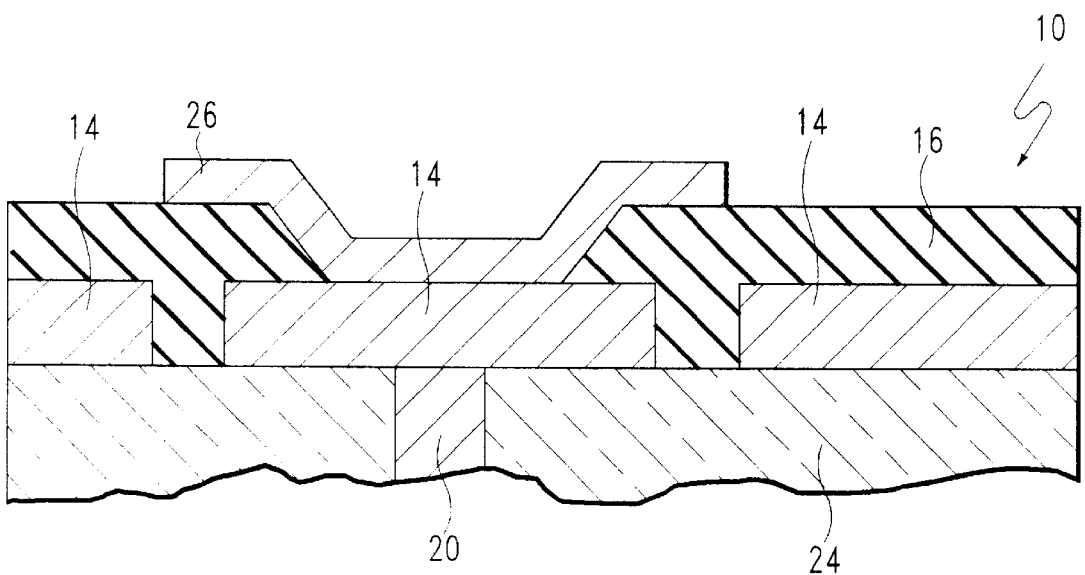
FIG. 4 is an enlarged sectional view representing a portion of a thin film capacitor formed in accordance with the present invention, after surface metallization to form interconnect features.

After laser ablation of the dielectric layer 16 to form a via opening through the dielectric layer 16, as shown in FIG. 3 and represented as block 44 in FIG. 5, electrically conductive interconnect structures 26 are formed on the surface of the metallized vias 18, 20, 22 in the ablated areas of the dielectric layer 16, as shown in FIG. 1 and FIG. 4. The formation of the interconnections, commonly referred to as top surface metallurgy (TSM) is well known, and provides for subsequent electrical communication with the top electrode layer 12, or sites for the subsequent direct attachment of single chips, multiple chip modules, integrated circuits, or other components. This latter step is represented by block 46 in FIG. 5. The top surface dielectric layer 28 is generally deposited over the top electrode layer 12 after formation of the top surface metallurgy features 26.

In summary, the 266 nm laser ablation process is an effective way to create vias in a barium strontium titanate dielectric film without ablating an underlying platinum electrode layer. The BST layer is readily ablated whereby a via is formed through the dielectric layer without significantly affecting the underlying platinum electrode. Thus, the method is selective, i.e., self-limiting. It etches the barium strontium titanate, but not the platinum. It is a clean, dry method that obviates the need for wet etching methods and resist processing that uses hazardous or undesirable chemicals to form vias in a dielectric film.

Although the present invention is described in terms of a preferred exemplary embodiment, with specific key material compositions and processing parameters, those skilled in the art will recognize that changes in those materials and parameters may be made without departing from the spirit of the invention. Such changes are intended to fall within the scope of the following claims. Other aspects, features, and advantages of the present invention may be obtained from a study of this disclosure and the drawings, along with the appended claims.

What is claimed is:

1. A method for forming vias in a dielectric film, comprising:

forming an electrode layer on a prepared substrate, said electrode layer being formed of an electrically conductive material having relatively low light energy absorption characteristics with respect to a laser beam;

depositing a dielectric layer on said electrode layer, said dielectric layer being formed of a material having a relatively high dielectric constant and relatively high light energy absorption characteristics with respect to said laser beam; and ablating areas of said dielectric layer by directing said laser beam on said areas whereby said dielectric material is removed from said areas of the dielectric layer without adversely affecting the underlying electrode layer.

2. A method for forming vias in a dielectric film, as set forth in claim 1, wherein said forming an electrode layer includes depositing a solid layer of said electrically conductive material on said substrate, and patterning said solid layer of electrically conductive material by removing areas of said electrically conductive material whereby the remaining electrically conductive material defines discrete electrical circuit features.

3. A method for forming vias in a dielectric film, as set forth in claim 1, wherein said electrically conductive material forming said electrode layer is platinum.

4. A method for forming vias in a dielectric film, as set forth in claim 1, wherein said material having a relatively high dielectric constant and light energy absorption characteristics is barium strontium titanate.

5. A method for forming vias in a dielectric film, as set forth in claim 1, wherein said laser beam is the fourth harmonic of the fundamental wavelength emitted from a neodymium doped yttrium-aluminum-garnet laser and has a wavelength of about 266 nm, a cross sectional area of about 3 μm, a fluence of from about 100 mJ/cm$^2$ to about 300 mJ/cm$^2$, and a pulse repetition rate of about 1 kHz, and said ablating areas of said dielectric layer includes sweeping said laser beam across the areas of the dielectric layer at a rate of about 0.3 mm/s.

6. A method for forming vias in a dielectric film, comprising:

forming an electrode layer on a prepared substrate, said electrode layer being formed of platinum;

depositing a dielectric layer on said electrode layer, said dielectric layer being formed of barium strontium titanate; and ablating areas of said dielectric layer by directing a beam of light energy emitted from a quadrupled yttrium-aluminum-garnet laser on said areas whereby said barium strontium titanate is removed from the areas of the dielectric layer without adversely affecting the underlying platinum material in the electrode layer.

7. A method for forming vias in a dielectric film, as set forth in claim 6, wherein beam of light energy emitted from said quadrupled yttrium-aluminum-garnet laser has a wavelength of about 266 nm, a cross sectional area of about 3 μm, a fluence of from about 100 mJ/cm$^2$ to about 300 mJ/cm$^2$, and a pulse repetition rate of about 1 kHz, and said ablating areas of said dielectric layer includes sweeping said beam of light energy across the preselected areas of the dielectric layer at a rate of about 0.3 mm/s.

* * * * *